United States Patent
Lin

(10) Patent No.: US 6,515,863 B2
(45) Date of Patent: Feb. 4, 2003

(54) HEAT-DISSIPATING DEVICE FOR PRINTED CIRCUIT BOARD

(75) Inventor: Sheng-Chieh Lin, Taoyuan Shien (TW)

(73) Assignee: Delta Electronics Inc. (TW)

( * ) Notice: Subject to any disclaimer, the term of this patent is extended or adjusted under 35 U.S.C. 154(b) by 0 days.

(21) Appl. No.: 09/933,216

(22) Filed: Aug. 20, 2001

(65) Prior Publication Data

US 2002/0186541 A1 Dec. 12, 2002

(51) Int. Cl.[7] .............................. H05K 7/20; H05K 9/00
(52) U.S. Cl. ........................ 361/719; 165/185; 257/718; 174/35 R; 174/35 GG; 361/715; 361/818
(58) Field of Search .............................. 165/80.2, 80.3, 165/185; 174/16.3, 35 R, 35 GC; 257/706–707, 712–713, 718–719; 361/704, 707, 710, 715, 719–721, 816, 818

(56) References Cited

U.S. PATENT DOCUMENTS 5,031,028 A * 7/1991 Galich et al. .............. 174/16.3

* cited by examiner

Primary Examiner—Gregory D. Thompson
(74) Attorney, Agent, or Firm—Fay, Sharpe, Fagan, Minnich & McKee, LLP

(57) ABSTRACT

A heat-dissipating device applied in a printed circuit board is disclosed. The heat-dissipating device includes a first heat-dissipating pad including a pin for connecting to the printed circuit board, a mask plate connected with the first heat-dissipating pad for preventing electromagnetic irradiation produced by an electronic device disposed on the printed circuit board from leaking, and a connecting element for connecting and fastening the mask plate to the first heat-dissipating pad.

15 Claims, 4 Drawing Sheets

HEAT-DISSIPATING DEVICE FOR PRINTED CIRCUIT BOARD

FIELD OF THE INVENTION

The present invention relates to a heat-dissipating device, and more particularly to a heat-dissipating device used for a printed circuit board.

BACKGROUND OF THE INVENTION

Generally, a printed circuit board of an electronic apparatus includes many electronic devices and operation circuits distributed thereon. When the electronic apparatus is operated, these electronic devices will produce heat further resulting in that the temperature to increase inside the electronic apparatus and the electronic devices cannot be efficiently operated. When the heat causes the temperature increases too high, the electronic apparatus could be broken down. Therefore, a heat-dissipating device is necessary to dispose on the printed circuit board for dissipating the heat produced by the electronic devices on the printed circuit board.

FIG. 1 is a diagram illustrating a decomposed structure of a heat-dissipating device according to the prior art. As shown in FIG. 1, a heat-dissipating device includes a heat-dissipating pad 12 and a mask plate 11, wherein the mask plate 11 is covered on the heat-dissipating pad 12. The heat-dissipating pad 12 includes pins 13 for fastening the heat-dissipating pad 12 on a printed circuit board 10. Similarly, the mask plate 11 also includes pins 16 for fastening the mask plate 11 on the printed circuit board 10. The mask plate 11 is used for preventing the electromagnetic irradiation from leaking out of the electronic apparatus.

Accordingly, the typical heat-dissipating device includes pins 13, 16 for the heat-dissipating pad 12 and the mask plate 11, respectively. Hence, holes 15, 14 of the printed circuit board 10 are required for receiving the pins 13, 16 and fastening the heat-dissipating pad 12 and the mask plate 11 on the printed circuit board 10 respectively. That is, the more the heat-dissipating pads are and the more the pins are required. The more the number of the pins is, the larger the area of the printed circuit board is occupied. Therefore, for the typical heat-dissipating device, too much space of the printed circuit board is wasted by disposing the pins and the distribution of electronic device and circuit is limited.

In addition, because the typical heat-dissipating pad or mask plate is integrally formed, the heat-dissipating pad cannot be efficiently in response to the position or the size of the electronic devices disposed on the printed circuit board. Therefore, the typical heat-dissipating device used for the printed circuit board is hard to achieve the excellent heat-dissipating effect.

Therefore, the purpose of the present invention is to develop a device to deal with the above situations encountered in the prior art.

SUMMARY OF THE INVENTION

It is therefore an object of the present invention to provide a heat-dissipating device applied in a printed circuit board for reducing the area occupied by the pins on the printed circuit board to increase the available space of the printed circuit board.

It is another object of the present invention to provide a heat-dissipating device applied in a printed circuit board for enhancing the heat-dissipating effect.

It is an additional object of the present invention to provide a heat-dissipating device applied in a printed circuit board for easily adding the heat-dissipating pad on the printed circuit board without changing the design or the distribution of electronic device and circuit on the printed circuit board.

According to an aspect of the present invention, a heat-dissipating device applied in a printed circuit board includes a first heat-dissipating pad including a pin for connecting to the printed circuit board, a mask plate connected with the first heat-dissipating pad for preventing electromagnetic irradiation produced by an electronic device disposed on the printed circuit board from leaking, and a connecting element for connecting and fastening the mask plate to the first heat-dissipating pad.

Preferably, the connecting element is made of metal.

Preferably, the first heat-dissipating pad is made of a metal material. The metal material is preferably aluminum.

Preferably, the mask plate is made of a metal material. The metal material is preferably copper.

Preferably, the first heat-dissipating pad is perpendicularly disposed to the printed circuit board.

Preferably, the first heat-dissipating pad further includes a hole for passing the connecting element therethrough to connect the first heat-dissipating pad to the mask plate.

Preferably, the mask plate further includes two lateral mask plates which are perpendicularly extended from two sides of the mask plate to the printed circuit board respectively. One of the lateral mask plates preferably has a first hole for passing the connecting element therethrough to connect with the first heat-dissipating pad. The first hole preferably has a relative position to the hole of the first heat-dissipating pad.

Preferably, the heat-dissipating device further includes a second heat-dissipating pad disposed in a parallel direction with the mask plate and disposed under the mask plate. The second heat-dissipating pad preferably includes a flank perpendicularly extended therefrom and disposed in a parallel direction with the first heat-dissipating pad. Preferably, the flank further includes a second hole having a relative position to the hole of the first heat-dissipating pad for passing the connecting element therethrough to connect the second heat-dissipating pad to the first heat-dissipating pad.

According to another aspect of the present invention, there is provided a heat-dissipating device applied in a printed circuit board.

The heat-dissipating device includes a mask plate including a pin for connecting to the printed circuit board and being used for preventing electromagnetic irradiation produced by an electronic device disposed on the printed circuit board from leaking, a first heat-dissipating pad connected to the mask plate, and a connecting element for connecting and fastening the mask plate to the first heat-dissipating pad.

Preferably, the heat-dissipating device further includes a second heat-dissipating pad disposed in a parallel direction with the mask plate and disposed under the mask plate. The second heat-dissipating pad preferably includes a flank perpendicularly extended therefrom and disposed in a parallel direction with the first heat-dissipating pad. Preferably, the flank further includes a second hole having a relative position to the hole of the first heat-dissipating pad for passing the connecting element therethrough to connect the second heat-dissipating pad to the first heat-dissipating pad.

According to an additional aspect of the present invention, there is provided a heat-dissipating device applied in a printed circuit board. The heat-dissipating device includes a first heat-dissipating pad comprising a pin for connecting to the printed circuit board, a second heat-dissipating pad connected to the first heat-dissipating pad and disposed in a parallel direction to the printed circuit board, a mask plate connected to the first heat-dissipating pad and being used for preventing electromagnetic irradiation produced by an electronic device disposed on the printed circuit board from leaking, and a connecting element for connecting and fastening the mask plate, the second heat-dissipating pad and the first heat-dissipating pad.

The present invention may best be understood through the following description with reference to the accompanying drawings, in which:

DETAILED DESCRIPTION OF THE PREFERRED EMBODIMENTS

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
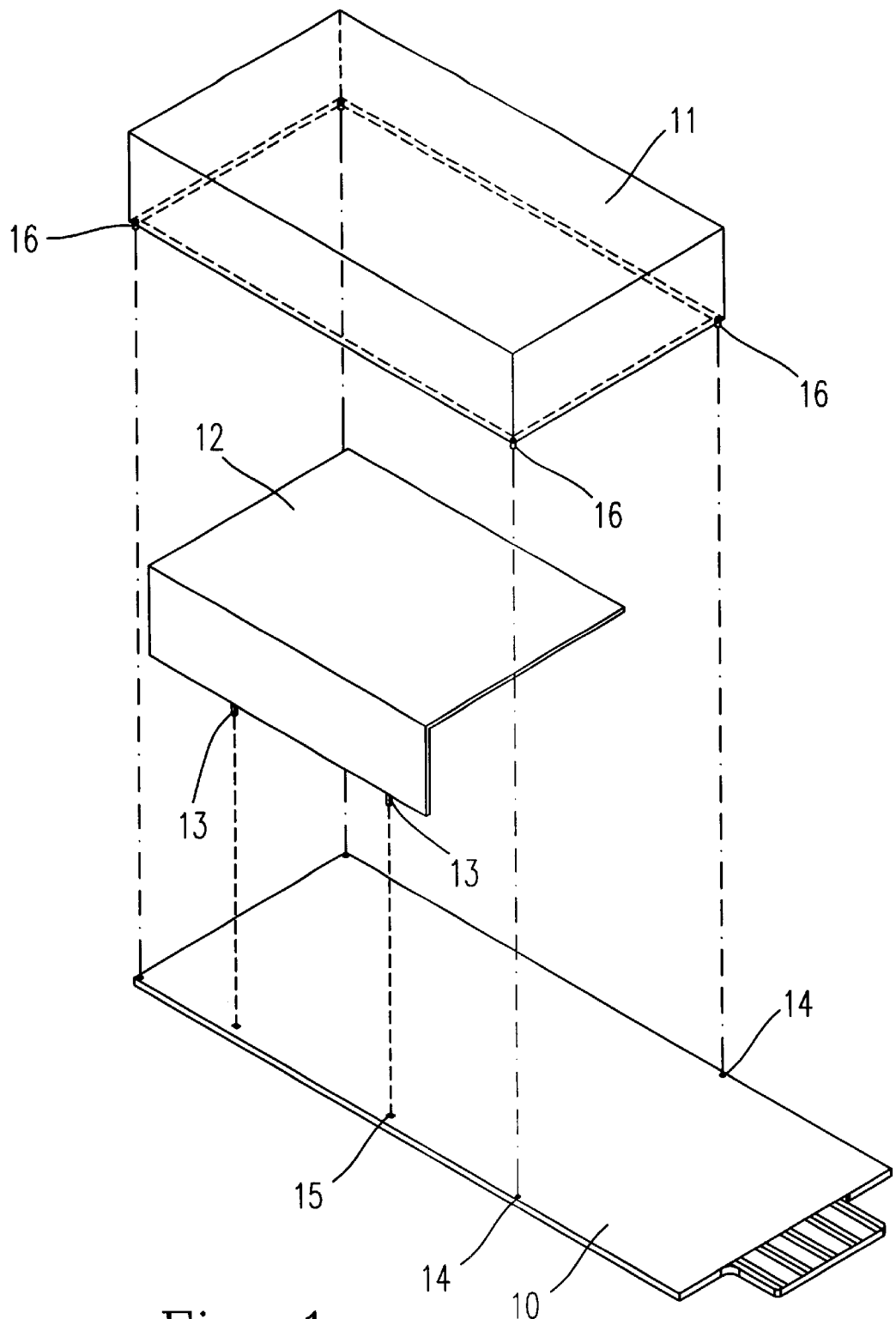
FIG. 1 is a diagram illustrating a decomposed structure of a heat-dissipating device according to the prior art.
Figure 2:
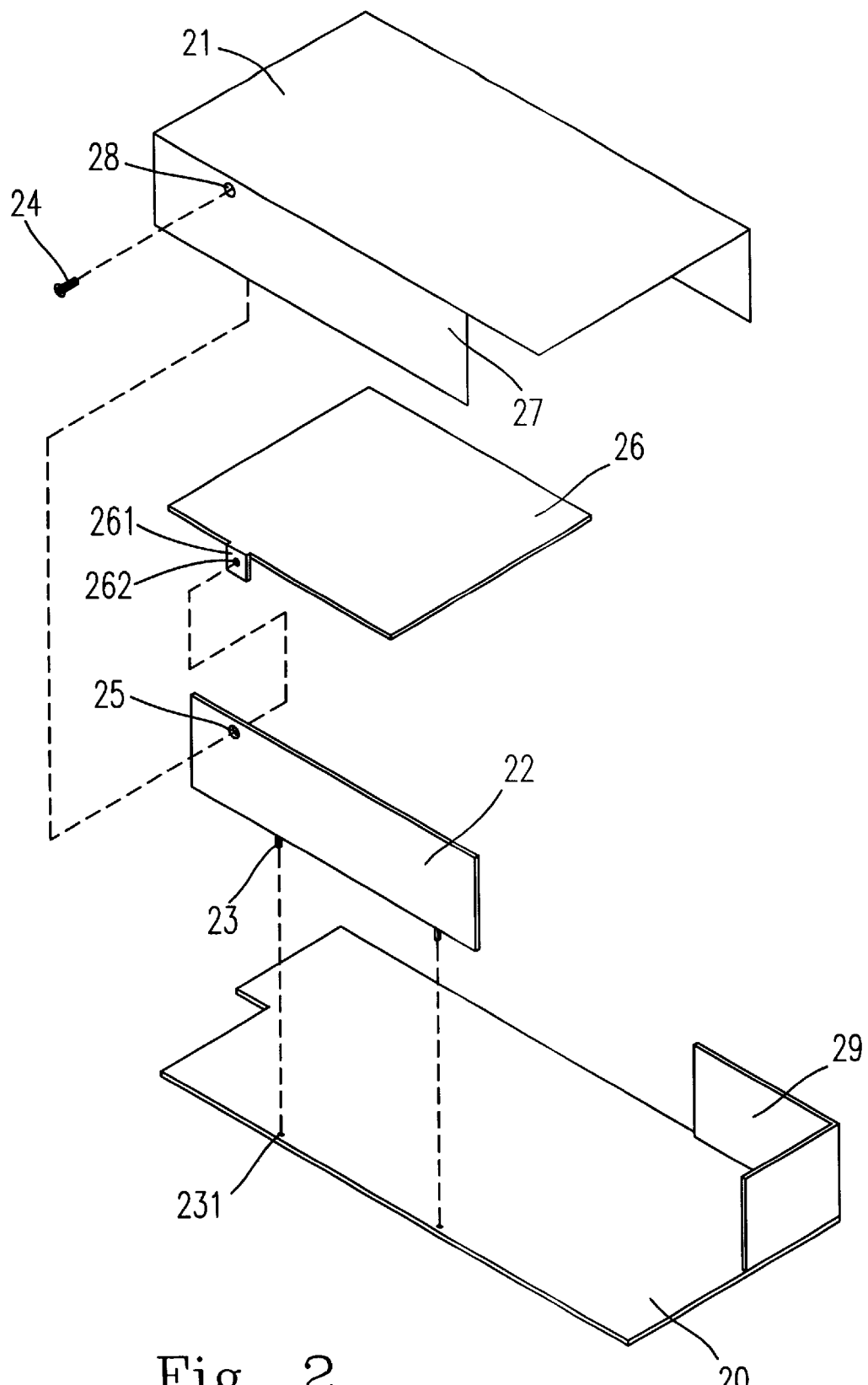
FIG. 2 is a diagram illustrating a decomposed structure of a heat-dissipating device according to a preferred embodiment of the present invention.

As shown in FIG. 2, the present invention provides a heat-dissipating device applied in a printed circuit board 20 includes a first heat-dissipating pad 22, a mask plate 21 and a connecting element 24. The first heat-dissipating pad 22 includes a pin 23 for inserting into a hole 231 of the printed circuit board 20. The mask plate 21 is used for preventing the leakage of the electromagnetic irradiation which is produced by the electronic device of the printed circuit board 20. The first heat-dissipating pad 22 and the mask plate 21 are fixed together by passing the connecting element 24 through a hole. 28 of the mask plate 21 and a hole 25 of the first heat-dissipating pad 22.

In addition, the heat-dissipating device can further includes a second heat-dissipating pad 26 as shown in FIG. 2 for increasing the heat-dissipating effect. The second heat-dissipating pad 26 disposed under the mask plate 21 includes a flank 261 perpendicularly extended from one side of the second heat-dissipating pad 26 and having a hole 262 thereon. The hole 262 is located at the relative position to the hole of the first heat-dissipating pad and the hole 28 of the mask plate 21 for being fixed together by the connecting element 24.

Moreover, as shown in FIG. 2, the heat-dissipating device of the present invention can also includes a third heat-dissipating pad 29 for enhancing the heat-dissipating effect.

The first, second and third heat-dissipating pads are made of metal material, and are preferably made of aluminum material. The mask plate 21 is made of metal material, and is preferably made of copper material. In addition, the connecting element 24 is also made of metal material. Therefore, when the first heat-dissipating pad 22 and the mask plate 21 are connected by the connecting element 24, the first heat-dissipating pad 22 also has a function of preventing the electromagnetic irradiation produced by an electronic device of the printed circuit board from leaking.

Figure 3:
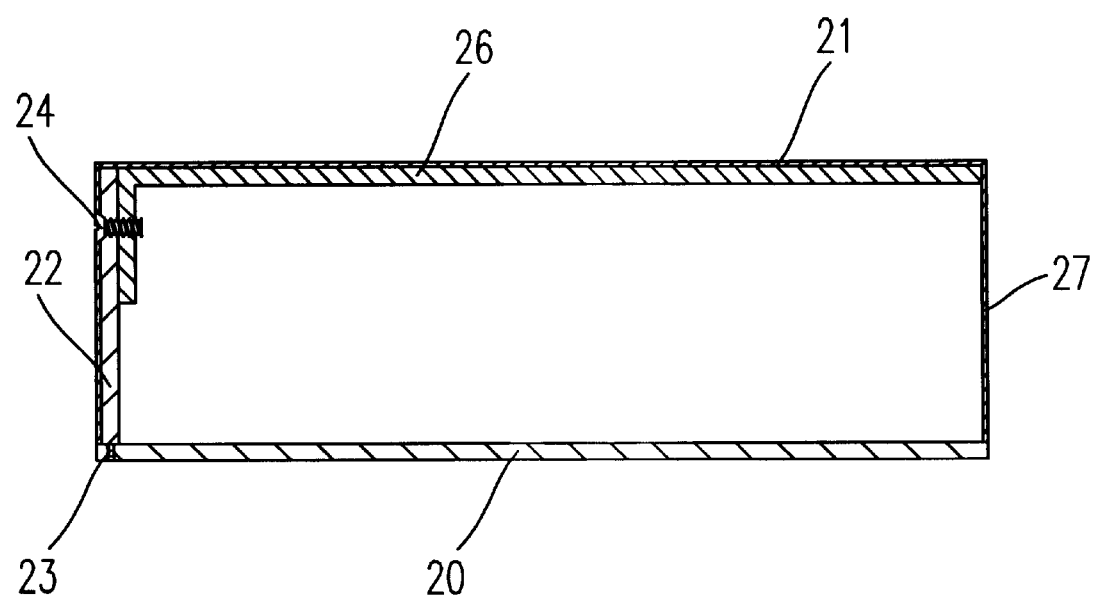
FIG. 3 is a cross-sectional view illustrating the heat-dissipating device of FIG. 2.

FIG. 3 is a cross-sectional view of the heat-dissipating device in FIG. 2. As shown in FIG. 3, the mask plate 21 includes two lateral mask plates 27 disposed at two sides of the mask plate 21, respectively. Each lateral mask 27 is perpendicularly extended from one side of the mask plate 21 to the printed circuit board 20. The connecting element 24 pass through the hole 28 of the mask plate 21, the hole 25 of the first heat-dissipating pad 22, and the hole 262 of the second heat-dissipating pad 26 from outside to inside in order for connecting and fastening those pads and plate together.

The pins 23 of the first heat-dissipating plate 22 as shown in FIG. 2 are used for fixing the first heat-dissipating plate 22 on the printed circuit board 20. Furthermore, because the mask plate 21 and the second heat-dissipating pad 26 are directly fixed with the first heat-dissipating pad 22 by the connecting element 24 according to the present invention, the mask plate 21 and the second heat-dissipating pad 26 do not require any pin structure thereon. Therefore, the area occupied by the pins on the circuit board 20 can be largely reduced.

Figure 4:
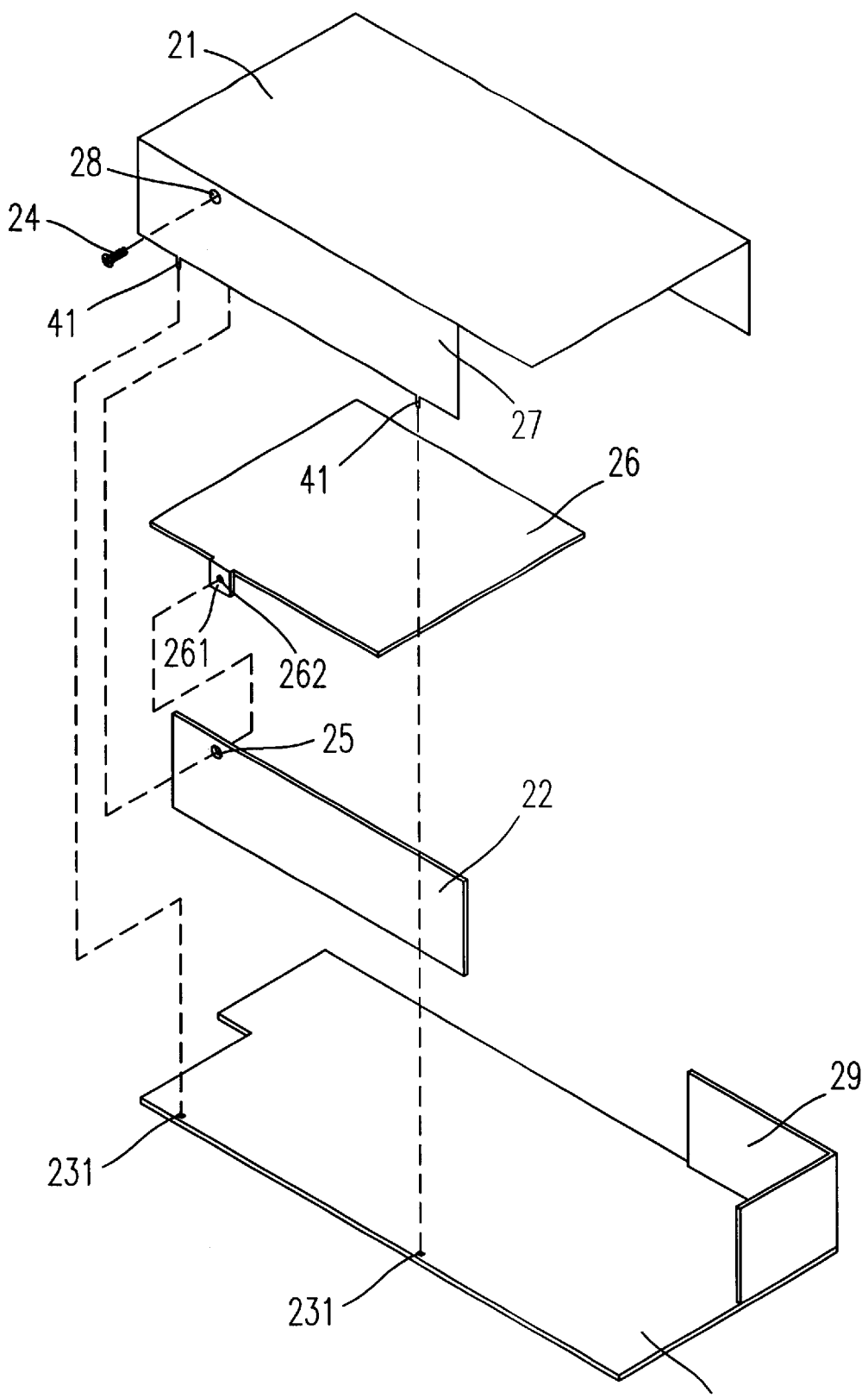
FIG. 4 is a diagram illustrating a decomposed structure of a heat-dissipating device according to another preferred embodiment of the present invention.

FIG. 4 is an alternative embodiment of the heat-dissipating device according to the present invention. The structure and relative position of the first, second and third heat-dissipating pads 22, 26, 29, the mask plate 21 and the printed circuit board 20 are similar to those of the above embodiment in FIG. 2 except that the mask plate 21 includes pins 41 instead of the first heat-dissipating pad 22. As shown in FIG. 4, the pins 41 are plugged into holes 231 of the circuit board 20 for fixing the mask plate 21 on the printed circuit board 20. The first and second heat-dissipating pads 22, 26 are connected and fastened to the mask plate 21 by the connecting element 24. Hence, the first and second heat-dissipating pads 22, 26 are indirectly fixed on the printed circuit board 20 by the pins 41 of the mask plate 21. In addition, more heat-dissipating pads can be added via the connecting element for fixing together. Therefore, it is unnecessary to increase the number of the pins. That is, the area occupied by the pins on the printed circuit board 20 according to the prior art is largely reduced and the available space on the printed circuit board for other electronic devices is increased.

In sum, the heat-dissipating device of the present invention provides the following advantages:

1. The present invention is not only used for heat dissipating but also preventing the electromagnetic irradiation from leaking.

2. Owing to the structure of the heat-dissipating device according to the present invention, the number of the pins can be reduced. Hence, the area occupied by the pins on the circuit board can be largely reduced. That is, the available space for distributing the electronic devices on the printed circuit board increases.

While the invention has been described in terms of what are presently considered to be the most practical and preferred embodiments, it is to be understood that the invention need not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A heat-dissipating device applied in a printed circuit board, comprising:
   a first heat-dissipating pad including a pin for connecting to said printed circuit board;
   a mask plate comprising two lateral mask plates perpendicularly extended from two sides thereof and connected with said first heat-dissipating pad for preventing electromagnetic irradiation produced by an electronic device disposed on said printed circuit board from leaking, wherein one of said lateral mask plates has a first hole; and
   a connecting element for connecting and fastening said mask plate to said first heat-dissipating pad through said first hole on one of said lateral mask plates.

2. The heat-dissipating device according to claim 1 wherein said connecting element is made of metal.

3. The heat-dissipating device according to claim 1 wherein said first heat-dissipating pad is made of a metal material.

4. The heat-dissipating device according to claim 3 wherein said metal material is aluminum.

5. The heat-dissipating device according to claim 1 wherein said mask plate is made of a metal material.

6. The heat-dissipating device according to claim 5 wherein said metal material is copper.

7. The heat-dissipating device according to claim 1 wherein said first heat-dissipating pad is perpendicularly disposed to said printed circuit board.

8. The heat-dissipating device according to claim 1 wherein said first heat-dissipating pad further comprises a hole for passing said connecting element therethrough to connect said first heat-dissipating pad to said mask plate.

9. The heat-dissipating device according to claim 1 wherein said first hole has a relative position to said hole of said first heat-dissipating pad.

10. The heat-dissipating device according to claim 1 further comprising a second heat-dissipating pad disposed in a parallel direction with said mask plate and disposed under said mask plate.

11. A heat-dissipating device applied in a printed circuit board, comprising:
    a first heat-dissipating pad including a pin for connecting to said printed circuit board;
    a mask plate connected with said first heat-dissipating pad for preventing electromagnetic irradiation produced by an electronic device disposed on said printed circuit board from leaking;
    a connecting element for connecting and fastening said mask plate to said first heat-dissipating pad; and
    a second heat-dissipating pad disposed in a parallel direction with said mask plate and disposed under said mask plate;
    said second heat-dissipating pad further comprises a flank perpendicularly extended therefrom and disposed in a parallel direction with said first heat-dissipating pad.

12. The heat-dissipating device according to claim 11 wherein said flank further comprises a second hole having a relative position to said hole of said first heat-dissipating pad for passing said connecting element therethrough to connect said second heat-dissipating pad to said first heat-dissipating pad.

13. A heat-dissipating device applied in a printed circuit board, comprising:
    a mask plate comprising a pin for connecting to said printed circuit board and being used for preventing electromagnetic irradiation produced by an electronic device disposed on said printed circuit board from leaking;
    a first heat-dissipating pad connected to said mask plate;
    a second heat-dissipating pad comprising a flank perpendicularly extended therefrom and disposed in a parallel direction with and under said mask plate, wherein said flank is disposed in a parallel direction with said first heat-dissipating pad; and
    a connecting element for connecting and fastening said mask plate to said first heat-dissipating pad.

14. The heat-dissipating device according to claim 13 wherein said flank further comprises a second hole having a relative position to said hole of said first heat-dissipating pad for passing said connecting element therethrough to connect said second heat-dissipating pad to said first heat-dissipating pad.

15. A heat-dissipating device applied in a printed circuit board, comprising:
    a first heat-dissipating pad comprising a pin for connecting to said printed circuit board;
    a second heat-dissipating pad connected to said first heat-dissipating pad and disposed in a parallel direction to said printed circuit board;
    a mask plate connected to said first heat-dissipating pad and being used for preventing electromagnetic irradiation produced by an electronic device disposed on said printed circuit board from leaking; and
    a connecting element for connecting and fastening said mask plate,
    said second heat-dissipating pad and said first heat-dissipating pad.

* * * * *